(12) United States Patent
Matsubayashi

(10) Patent No.: US 10,037,903 B2
(45) Date of Patent: Jul. 31, 2018

(54) BONDING DEVICE, BONDING METHOD AND PRESSURE APPLYING UNIT

(71) Applicant: SHINDENGEN ELECTRIC MANUFACTURING CO., LTD., Chiyoda-ku, Tokyo (JP)

(72) Inventor: Ryo Matsubayashi, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/122,927

(22) PCT Filed: Mar. 31, 2015

(86) PCT No.: PCT/JP2015/060290
§ 371 (c)(1),
(2) Date: Sep. 1, 2016

(87) PCT Pub. No.: WO2016/157461
PCT Pub. Date: Oct. 6, 2016

(65) Prior Publication Data
US 2017/0076963 A1   Mar. 16, 2017

(51) Int. Cl.
*H01L 21/68* (2006.01)
*H01L 21/67* (2006.01)
*H01L 23/00* (2006.01)

(52) U.S. Cl.
CPC .. *H01L 21/67092* (2013.01); *H01L 21/67109* (2013.01); *H01L 21/68* (2013.01); *H01L 24/29* (2013.01); *H01L 24/83* (2013.01)

(58) Field of Classification Search
None
See application file for complete search history.

(56) References Cited

U.S. PATENT DOCUMENTS

| 3,151,862 A | 10/1964 | Nicosia |
| 3,376,808 A | 4/1968 | Beckett et al. |

(Continued)

FOREIGN PATENT DOCUMENTS

| JP | 2010114208 | * | 5/2010 |
| JP | 2012-9703 A | | 1/2012 |
| JP | 2015-56550 A | | 3/2015 |

OTHER PUBLICATIONS

International Search Report in PCT/JP2015/060297, dated Jun. 9, 2015.

(Continued)

*Primary Examiner* — Duy T Nguyen
*Assistant Examiner* — Bo Bin Jang
(74) *Attorney, Agent, or Firm* — Hauptman Ham, LLP

(57) ABSTRACT

Provided is a bonding device for bonding a substrate and an electronic part of an assembled body which is formed by mounting the electronic part on the substrate with a metal particle paste sandwiched therebetween. The bonding device is configured to bond the substrate and the electronic part to each other by heating a pressure applying unit having a first transfer member and a second transfer member which transfer pressure and heat to the assembled body n a state where the assembled body is sandwiched between the first transfer member and the second transfer member while applying pressure to the pressure applying unit. The bonding device further includes a heating mechanism part having a first heating part and a second heating part arranged at positions opposite to each other, a positioning mechanism part, and a pressure applying mechanism part.

8 Claims, 8 Drawing Sheets

(56) References Cited

U.S. PATENT DOCUMENTS

| | | | |
|---|---|---|---|
| 5,592,021 A | 1/1997 | Meschter et al. | |
| 2003/0000060 A1 | 1/2003 | Ichikawa et al. | |
| 2010/0024667 A1 | 2/2010 | Ikura | |
| 2010/0330776 A1* | 12/2010 | Zuniga | B32B 37/003 438/455 |
| 2011/0049221 A1 | 3/2011 | Blais et al. | |
| 2012/0247664 A1 | 10/2012 | Kobayashi | |
| 2015/0115452 A1 | 4/2015 | Yoon et al. | |
| 2015/0257280 A1 | 9/2015 | Ciliox et al. | |
| 2016/0126215 A1 | 5/2016 | Imbert et al. | |

OTHER PUBLICATIONS

International Search Report in PCT/JP2015/060296, dated Jun. 9, 2015.

International Search Report in PCT/JP2015/060290, dated Jun. 9, 2015.

International Search Report in PCT/JP2015/060286, dated Jun. 9, 2015.

Kaye and Laby http://www.kayelaby.npl.co.uk/general_physics/2_3/2_3_7.html May 22, 2017, 11pp.

Office Action in U.S. Appl. No. 15/122,925, dated Apr. 21, 2017.

Restriction Requirement in U.S. Appl. No. 15/122,926, dated May 26, 2017.

Office Action in U.S. Appl. No. 15/122,925, dated Sep. 29, 2017, 10pp.

Office Action in U.S. Appl. No. 15/122,926, dated Aug. 7, 2017, 18pp.

Office Action in U.S. Appl. No. 15/122,929, dated Jul. 28, 2017, 16pp.

Engineering Toolbox (www. engineeringtoolbox. com) Aug. 1, 2017, 3pp.

Euro Inox Stainless Steel: Tables of Technical Properties, 2007, 24pp.

Notice of Allowance in U.S. Appl. No. 15/122,925, dated Dec. 28, 2017, 11pp.

Office Action in U.S. Appl. No. 15/122,929, dated Jan. 8, 2018, 20pp.

Office Action in U.S. Appl. No. 15/122,926, dated Jan. 23, 2018, 18pp.

Office Action in U.S. Appl. No. 15/122,926, dated May 15, 2018, 11pp.

Notice of Allowance in U.S. Appl. No. 15/122,929, dated May 23, 2018, 17pp.

* cited by examiner

BONDING DEVICE, BONDING METHOD AND PRESSURE APPLYING UNIT

RELATED APPLICATIONS

The present application is a National Stage of PCT International Application No. PCT/JP2015/060290, filed Mar. 31, 2015.

TECHNICAL FIELD

The present invention relates to a bonding device, a bonding method and a pressure applying unit.

BACKGROUND ART

There has been known a semiconductor device having a structure where a substrate on which a conductor pattern is formed and a semiconductor element are bonded to each other with a metal particle paste interposed therebetween (see patent literature 1, for example). The metal particle paste is a conductive paste of a low-temperature sintering type which contains nano-sized or submicron-sized metal particles in a solvent, and makes use of a low-temperature sintering phenomenon and high surface activity of the metal particles.

In the above-mentioned semiconductor device, it is considered that the substrate and the semiconductor element are bonded to each other using a following bonding device (conventional bonding device 900). As shown in FIG. 8, the conventional bonding device 900 is a bonding device where a substrate 12 and an electronic part 14 (semiconductor element) are bonded to each other by applying pressure to an assembled body 10 which is formed by arranging the electronic part 14 on the substrate 12 on which a conductor pattern is formed with a metal particle paste 16 interposed therebetween while heating the assembled body 10.

The conventional bonding device 900 includes: a heating mechanism part 920 having a first heating part 922 and a second heating part 924 arranged at positions oppositely facing each other; and a pressure applying mechanism part (not shown in the drawing) which applies pressure to the assembled body 10 by moving the second heating part 924 in a direction toward the second heating part 924 from the first heating part 922. The first heating part 922 is positioned below the second heating part 924.

In the conventional bonding device 900, pressure is applied to the assembled body 10 while heating the assembled body 10 in such a manner that the assembled body 10 is arranged on the first heating part 922 and, thereafter, the assembled body 10 is heated using the first heating part 922 and the second heating part 924 by moving the second heating part 924 downward.

According to the conventional bonding device 900, the bonding device 900 includes the pressure applying mechanism part which applies pressure to the assembled body 10 by moving the second heating part 924. Accordingly, it is possible to apply pressure to the assembled body 10 while heating the assembled body 10 using the first heating part 922 and the second heating part 924 and hence, the substrate 12 and the electronic part 14 can be bonded to each other with the metal particle paste 16 interposed therebetween.

CITATION LIST

Patent Literature

Patent Literature 1: JP-A-2012-9703

SUMMARY OF INVENTION

Technical Problem

However, in the conventional bonding device 900, pressure is applied to the assembled body 10 while heating the assembled body 10 by the first heating part 922 and the second heating part 924 after the assembled body 10 is arranged on the first heating part 922 and hence, heat is transferred to the metal particle paste 16 from the first heating part 922 before pressure is applied to the assembled body 10 whereby the metal particle paste 16 partially exhibits a sintering reaction (solidifying reaction). Accordingly, there arises a drawback that the substrate 12 and the electronic part 14 cannot be bonded to each other with a high bonding strength.

Further, in an actual operation, it is difficult to move the second heating part 924 while keeping parallelism of the second heating part 924 with respect to the first heating part 922 and hence, there may be a case where the difference is generated between pressures applied to respective portions of an electronic part when pressure is applied to the electronic part whereby there may also arise a drawback that there is a possibility that uniform bonding of the substrate 12 and the electronic part 14 becomes difficult.

Such a problem is not a problem which occurs only in manufacturing a semiconductor device having the structure where a substrate on which a conductor pattern is formed and a semiconductor element are bonded to each other using a metal particle paste, and is also a problem which is likely to occur in bonded bodies in general having the structure where "a substrate on which a conductor pattern is formed or another substrate" and "a semiconductor element or another electronic part" are bonded to each other using a metal particle paste.

The present invention has been made to overcome the above-mentioned drawbacks, and it is an object of the present invention to provide a bonding device capable of bonding a substrate and an electronic part to each other with a bonding strength higher than a bonding strength used in the prior art and also capable of uniformly bonding the substrate and the electronic part to each other. It is another object of the present invention to provide a bonding method using such a bonding device. It is still another object of the present invention to provide a pressure applying unit used in such a bonding device.

Solution to Problem

[1]

The bonding device of the present invention is bonding device for bonding a substrate and an electronic part of an assembled body which is formed by mounting the electronic part on the substrate with a metal particle paste sandwiched therebetween, the bonding device being configured to bond the substrate and the electronic part to each other by heating a pressure applying unit having a first transfer member and a second transfer member which transfer pressure and heat to the assembled body in a state where the assembled body is sandwiched between the first transfer member and the second transfer member while applying pressure to the pressure applying unit, wherein
the bonding device further comprises:
a heating mechanism part having a first heating part and a second heating part arranged at positions opposite to each other;

a positioning mechanism part for positioning the pressure applying unit at a position where the pressure applying unit is in contact with neither the first heating part nor the second heating part in a space defined between the first heating part and the second heating part; and a pressure applying mechanism part for applying pressure to the pressure applying unit by moving at least one of the first heating part and the second heating part in a direction from one of the first heating part and the second heating part toward the other of the first heating part and the second heating part.

[2]

In the bonding device of the present invention, it is preferable that the first transfer member include: a plateau portion projecting toward the outside at a center portion of a surface of the first transfer member on a side opposite to a surface of the first transfer member which faces the second transfer member in an opposed manner; and a shoulder portion formed around the plateau portion; and the positioning mechanism part include:

a tray having a bottom surface in which an opening portion which allows the insertion of the plateau portion therein at the time of accommodating the pressure applying unit in the tray is formed and on which a support portion for supporting the shoulder portion at the time of accommodating the pressure applying unit in the tray is formed around the opening portion; and a positioning part capable of positioning the pressure applying unit at a position where the pressure applying unit is in contact with neither the first heating part nor the second heating part by positioning the tray in which the pressure applying unit is accommodated.

[3]

In the bonding device of the present invention, it is preferable that the first heating part be positioned below the second heating part, and the pressure applying mechanism part be configured to apply pressure to the pressure applying unit by moving the first heating part upward.

[4]

In the bonding device of the present invention, it is preferable that the pressure applying mechanism part be configured to move the pressure applying unit and the tray in a vertical direction by moving the first heating part in a vertical direction, the first heating part be arranged on a first transfer member side of the pressure applying unit, and the second heating part be arranged on a second transfer member side of the pressure applying unit, and the support portion be brought into a state where the support portion supports the shoulder portion when the first transfer member is not in contact with the first heating part, and be brought into a state where the support portion is disposed away from the shoulder portion when the first transfer member is in contact with the first heating part.

[5]

In the bonding device of the present invention, it is preferable that the pressure applying mechanism part be configured such that, after the pressure applying mechanism part heats the pressure applying unit while applying pressure to the pressure applying unit, the pressure applying mechanism part brings the pressure applying unit into a state where the pressure applying unit is in contact with neither the first heating part nor the second heating part in a space defined between the first heating part and the second heating part by moving the first heating part downward.

[6]

In the bonding device of the present invention, it is preferable that the pressure applying mechanism part be configured to apply pressure to the pressure applying unit by moving the first heating part upward and by moving the second heating part downward.

[7]

In the bonding device of the present invention, it is preferable that the bonding device further include: a chamber disposed at a position where the chamber surrounds the first heating part and the second heating part; and a vacuum pump for creating a vacuum in the chamber.

[8]

In the bonding device of the present invention, it is preferable that the bonding device further include an inert gas supply mechanism capable of supplying an inert gas into the chamber.

[9]

In the bonding device of the present invention, it is preferable that the first heating part be positioned above the second heating part, and the pressure applying mechanism part be configured to apply pressure to the pressure applying unit by moving the first heating part downward.

[10]

The bonding method of the present invention is a bonding method for bonding a substrate and an electronic part of an assembled body which is formed by mounting the electronic part on the substrate with a metal particle paste sandwiched therebetween using the bonding device described in any one of the above-mentioned [1] to [9], wherein the substrate and the electronic part are bonded to each other by heating a pressure applying unit having a first transfer member and a second transfer member which transfer pressure and heat to the assembled body in a state where the assembled body is sandwiched between the first transfer member and the second transfer member while applying pressure to the pressure applying unit, the bonding method comprising in the following order:

a pressure applying unit positioning step for positioning the pressure applying unit at a position where the pressure applying unit is in contact with neither the first heating part nor the second heating part in a space defined between the first heating part and the second heating part by the positioning mechanism part;

a pressure applying unit moving step for moving the pressure applying unit in a direction from one of the first heating part and the second heating part toward the other of the first heating part and the second heating part by moving at least one of the first heating part and the second heating part in a direction from one of the first heating part and the second heating part toward the other of the first heating part and the second heating part by the pressure applying mechanism part; and a pressure applying unit pressure-applying and heating step for heating the pressure applying unit while applying pressure to the pressure applying unit by moving at least one of the first heating part and the second heating part in a direction from one of the first heating part and the second heating part to the other of the first heating part and the second heating part by the pressure applying mechanism part.

[11]

The pressure applying unit of the present invention is a pressure applying unit using the bonding device according to any one of the above-mentioned [1] to [9], wherein the pressure applying unit comprises the first transfer member and the second transfer member arranged at positions opposite to each other for transferring pressure and heat to the assembled body, and the first transfer member includes: a plateau portion which projects toward the outside at a center portion of a surface of the first transfer member on a side opposite to a surface of the first transfer member which faces the second transfer member in an opposed manner; and a shoulder portion formed around the plateau portion.

Advantageous Effects of Invention

According to the bonding device and the bonding method of the present invention, the bonding device includes the positioning mechanism part for positioning the pressure applying unit at a position where the pressure applying unit is in contact with neither the first heating part nor the second heating part. With such a configuration, it is possible to heat the pressure applying unit while applying pressure to the pressure applying unit using the first heating part and the second heating part after positioning the pressure applying unit at the position where the pressure applying unit is in contact with neither the first heating part nor the second heating part. Accordingly, it is possible to prevent heat from being transferred to a metal particle paste from the first heating part before pressure is applied to the pressure applying unit thus preventing the metal particle paste from partially generating a sintering reaction (solidifying reaction). As a result, the substrate and the electronic part can be bonded to each other with a bonding strength higher than a bonding strength used in the prior art.

Further, according to the bonding device, the bonding method and the pressure applying unit of the present invention, the pressure applying unit having the first transfer member and the second transfer member which transfer pressure and heat to the assembled body in a state where the assembled body is sandwiched between the first transfer member and the second transfer member is used and hence, a time necessary for transferring heat to the metal particle paste can be delayed compared to the conventional bonding device 900. Accordingly, even when pressure is applied to the pressure applying unit in a state where the first heating part and the second heating part are heated, it is possible to prevent heat from being transferred to the metal particle paste from the first heating part before pressure is applied to the pressure applying unit thus preventing the metal particle paste from partially generating a sintering reaction. As a result, also from such a viewpoint, the substrate and the electronic part can be bonded to each other with a bonding strength higher than a bonding strength used in the prior art.

Further, according to the bonding device, the bonding method and the pressure applying unit of the present invention, the pressure applying unit having the first transfer member and the second transfer member which transfer pressure and heat to the assembled body in a state where the assembled body is sandwiched between the first transfer member and the second transfer member is used. With such a configuration, by moving the second transfer member while keeping parallelism of the second transfer member with respect to the first transfer member, it is possible to prevent the occurrence of the difference in pressure between respective portions of the electronic part. As a result, the substrate and the electronic part can be uniformly bonded to each other.

Further, according to the bonding device, the bonding method and the pressure applying unit of the present invention, the pressure applying unit having the first transfer member and the second transfer member which transfer pressure and heat to the assembled body in a state where the assembled body is sandwiched between the first transfer member and the second transfer member is used. With such a configuration, even when pressure is applied to the pressure applying unit in a state where the first heating part and the second heating part are heated as described above, it is possible to prevent heat from being transferred to the metal particle paste from the first heating part before pressure is applied to the pressure applying unit. Accordingly, it is unnecessary to change temperatures of the first heating part and the second heating part when pressure is being applied to the pressure applying unit and hence, the substrate and the electronic part can be bonded to each other in a relatively short tact time.

According to the pressure applying unit of the present invention, the first transfer member includes: the plateau portion which projects toward the outside at the center portion of the surface of the first transfer member on a side opposite to the surface of the first transfer member which faces the second transfer member in an opposed manner; and the shoulder portion formed around the plateau portion. With such a configuration, in mounting the pressure applying unit on the bonding device by accommodating the pressure applying unit in the tray, it is possible to provide a state where the tray supports the pressure applying unit by making the support portion of the tray supports the shoulder portion. At the time of applying pressure to the pressure applying unit, by pushing the plateau portion toward the inside from the outside, it is possible to provide a state where the pressure applying unit is not supported by the tray. Accordingly, it is possible to apply pressure to the pressure applying unit without being influenced by the tray. As a result, the substrate and the electronic part can be bonded to each other more uniformly.

According to the pressure applying unit of the present invention, the first transfer member includes: the plateau portion which projects toward the outside at the center portion of the surface of the first transfer member on a side opposite to the surface of the first transfer member which faces the second transfer member in an opposed manner; and the shoulder portion formed around the plateau portion. With such a configuration, at the time of accommodating the pressure applying unit in the tray, the position of the pressure applying unit is minimally displaced by inserting the plateau portion into the opening portion formed in the tray.

BRIEF DESCRIPTION OF DRAWINGS

FIG. 1A is a cross-sectional side view of the bonding device 100, and FIG. 1B is a cross-sectional side view of a pressure applying unit 200 according to the embodiment 1.

FIG. 4A to FIG. 4C are views showing respective steps. In FIG. 4A to FIG. 4C, a chamber 110 is omitted (hereinafter, the same being applicable to FIG. 5 to FIG. 7).

FIG. 5A to FIG. 5C are views showing respective steps.

FIG. 6A to FIG. 6C are views showing respective steps.

FIG. 7A to FIG. 7C are views for explaining the bonding method according to the embodiment 1. FIG. 7A and FIG. 7B are views showing respective steps.

In FIG. 8, symbol 910 indicates a chamber, and symbol 928 indicates a heater.

DESCRIPTION OF EMBODIMENTS

Figure 1A:
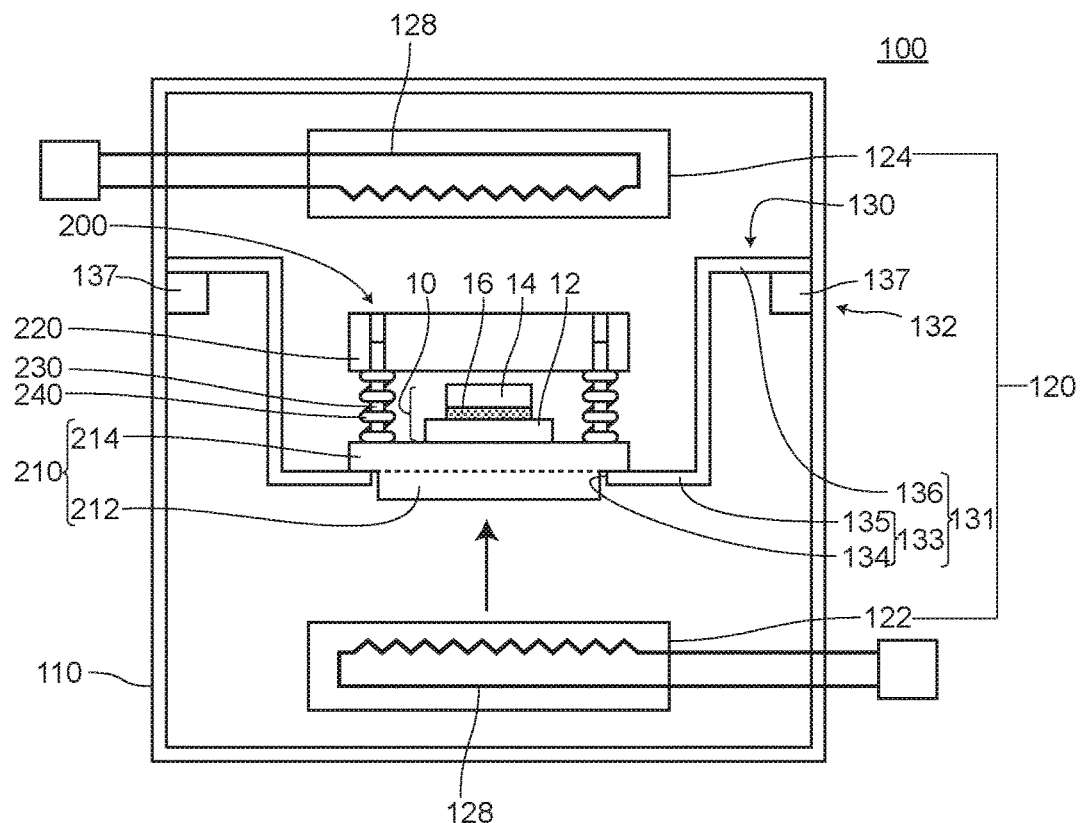
FIG. 1A and FIG. 1B are views for explaining a bonding device 100 according to an embodiment 1.

Hereinafter, a bonding device, a bonding method and a pressure applying unit of the present invention are explained by reference to embodiments shown in the drawings.

Embodiment 1

Firstly, an assembled body 10 is explained.

As shown in FIG. 1, the assembled body 10 is configured such that an electronic part 14 is arranged on a substrate 12 on which a conductor pattern is formed with a metal particle paste 16 interposed therebetween.

In this specification, "substrate" means a part on which an electronic part is mounted.

The substrate 12 of the embodiment 1 is, for example, a printed circuit board where a conductor pattern is formed on a body made of a non-conductive material. As a material for forming the substrate 12, a material which has resistance to a sintering temperature of a metal particle paste 16 (for example, 300° C. although the sintering temperature depends on a kind of material) can be used. For example, a resin or a ceramic having heat resistance is used for forming the body, and metal is used for forming the conductor pattern.

The substrate to which the present invention is applicable may be a DCB (Direct Copper Bond) substrate or a lead frame. Further, it is sufficient that the substrate to which the present invention is applicable is a substrate on which an electronic part can be mounted. For example, the substrate may be a silicon chip. That is, the present invention is also applicable to the connection between a silicon chip and a conductive connector.

The electronic part 14 is a part which is used in an electric product, for example, and is particularly required to be electrically connected to the substrate 12. As a specific example of the electronic part 14, a semiconductor element (for example, a semiconductor chip on which an integrated circuit is mounted), an electric motor, a resistor, a capacitor, a piezoelectric element, a connector, a switch, an antenna, and a conductive connector can be named. The method of manufacturing a bonded body of the present invention is particularly preferably applicable to a case where a bonded body formed by bonding at least one semiconductor element and a substrate to each other, that is, a semiconductor device is manufactured. Although the number of electronic parts 14 used in the embodiment 1 is one, the present invention is also applicable to the case where two or more electronic parts are used. When two or more electronic parts are used, the electronic parts may be formed of one kind of electronic part, or may be formed of two or more kinds of electronic parts.

The metal particle paste 16 is a conductive paste of a low-temperature sintering type which contains nano-sized or submicron-sized metal particles in a solvent, and makes use of a low-temperature sintering phenomenon and high surface activity of the metal particles. The metal particle paste 16 contains metal particles, an organic dispersion material, an organic dispersion material capturing material, and a volatile organic solvent, for example. As the metal particles, metal nanoparticles (for example, metal particles having an average diameter of approximately 100 nm or less), metal submicron particles (for example, metal particles having an average diameter which falls within a range of from approximately 0.1 μm to approximately 1 μm), or metal particles formed of both the metal nanoparticles and the metal submicron particles can be used. As a material for forming metal particles, silver, gold or copper can be used, for example. The organic dispersion material covers surfaces of metal particles at a room temperature, and has a function of holding metal particles in an independently dispersed state. The organic dispersion material capturing material reacts with the organic dispersion material which covers metal particles at a high temperature and performs a function of removing the organic dispersion material from surfaces of the metal particles. The volatile organic solvent has a function of capturing a chemical reaction product formed between the organic dispersion material and the organic dispersion material capturing material and also performs a function of releasing the chemical reaction product to the outside of a system in the form of a gas.

Next, a bonding device 100 according to the embodiment 1 is explained.

The bonding device 100 according to the embodiment 1 is a bonding device which bonds the substrate 12 and the electronic part 14 to each other by heating while applying pressure to a pressure applying unit 200.

Firstly, the pressure applying unit 200 according to the embodiment 1 is explained.

Figure 1B:
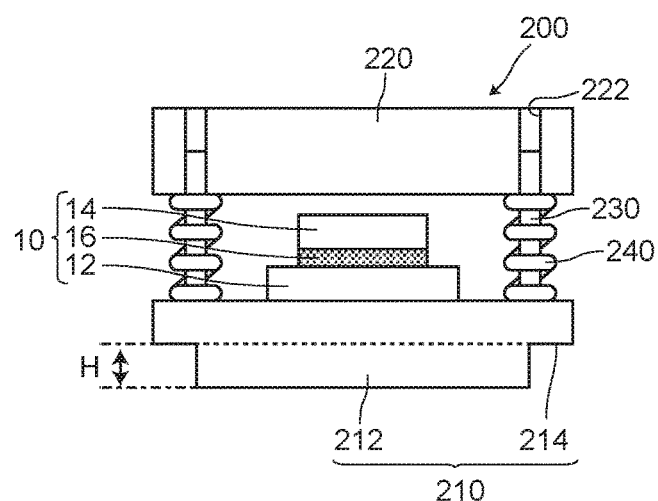

As shown in FIG. 1B, the pressure applying unit 200 includes a first transfer member 210, a second transfer member 220, guide members 230, and distance adjusting mechanisms 240. The pressure applying unit 200 sandwiches, between the first transfer member 210 and the second transfer member 220, the assembled body 10 formed by mounting the electronic part 14 on the substrate 12 with the metal particle paste 16 interposed therebetween and transfers pressure and heat. The first transfer member 210 and the second transfer member 220 are connected to each other by way of the guide members 230.

The first transfer member 210 is a plate-like member on which the assembled body 10 is mounted. The first transfer member 210 includes: a plateau portion 212 which projects toward the outside on a center portion of a surface of the first transfer member 210 on a side opposite to a surface of the first transfer member 210 which faces the second transfer member 220 in an opposed manner; and shoulder portions 214 which are formed around the plateau portion 212. The first transfer member 210 has a quadrangular shape as viewed in a plan view (including not only a strict quadrangular shape but also an quadrangular shape as a whole such as a quadrangular shape having chamfered corners, the same definition being applicable hereinafter), and the guide member 230 is formed in an erected manner on respective corner portions of the first transfer member 210. In the first transfer member 210, assuming a height of the plateau portion 212 with respect to the shoulder portions 214 as H, and assuming a thickness of a tray 131 described later as D, the relationship of H>D is established.

Figure 5A:
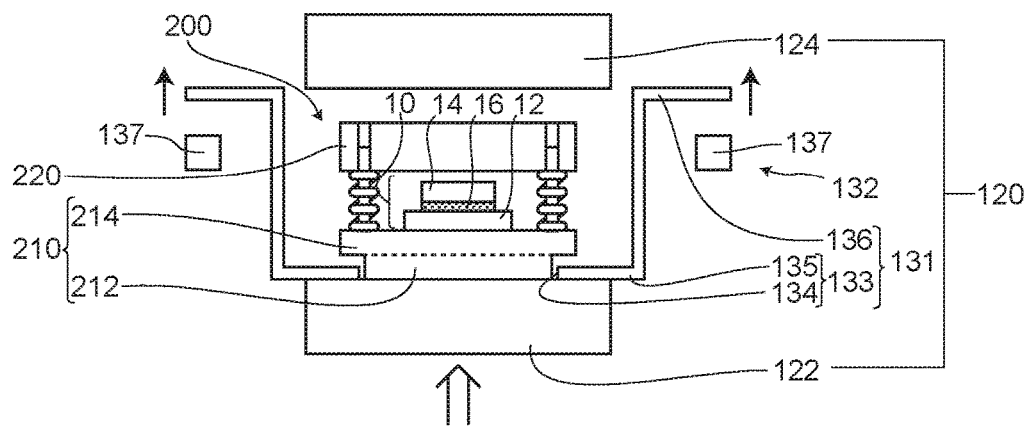
FIG. 5A to FIG. 5C are views for explaining the bonding method according to the embodiment 1.
Figure 5B:
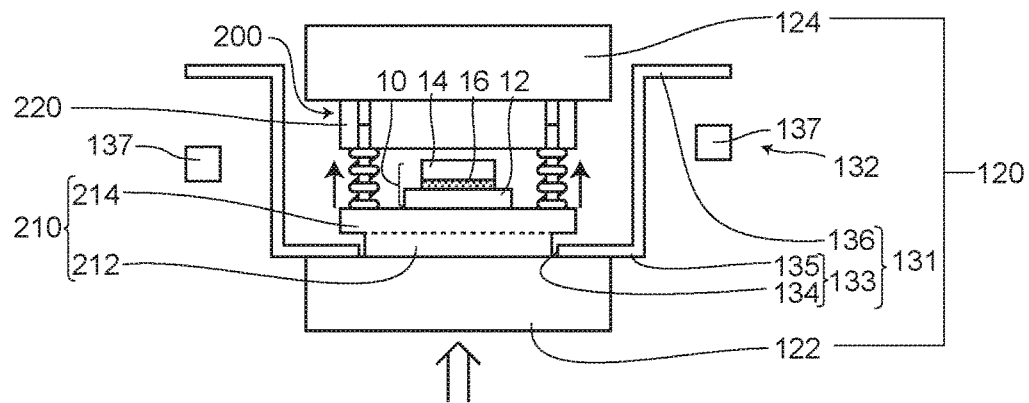
Figure 5C:
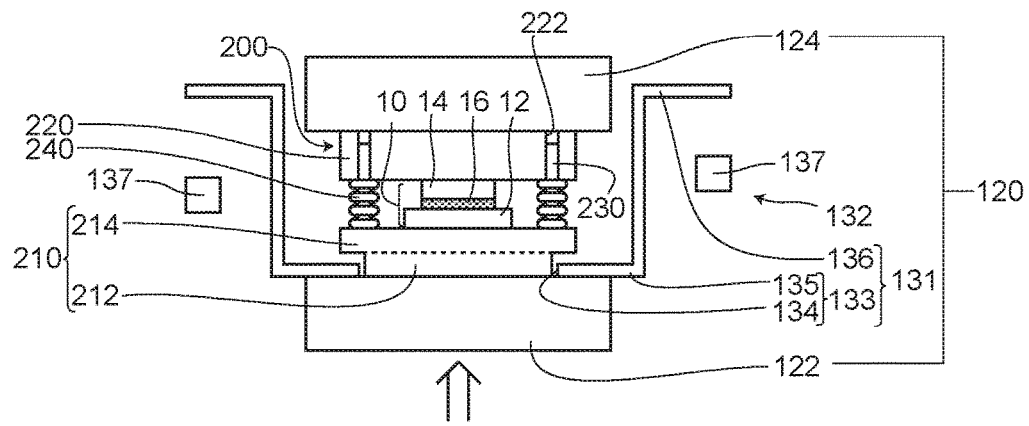
Figure 6A:
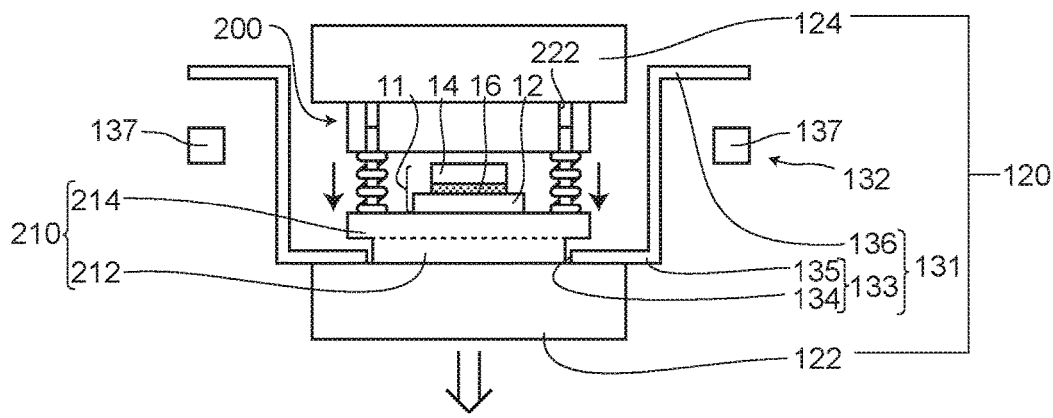
FIG. 6A to FIG. 6C are views for explaining the bonding method according to the embodiment 1.
Figure 6B:
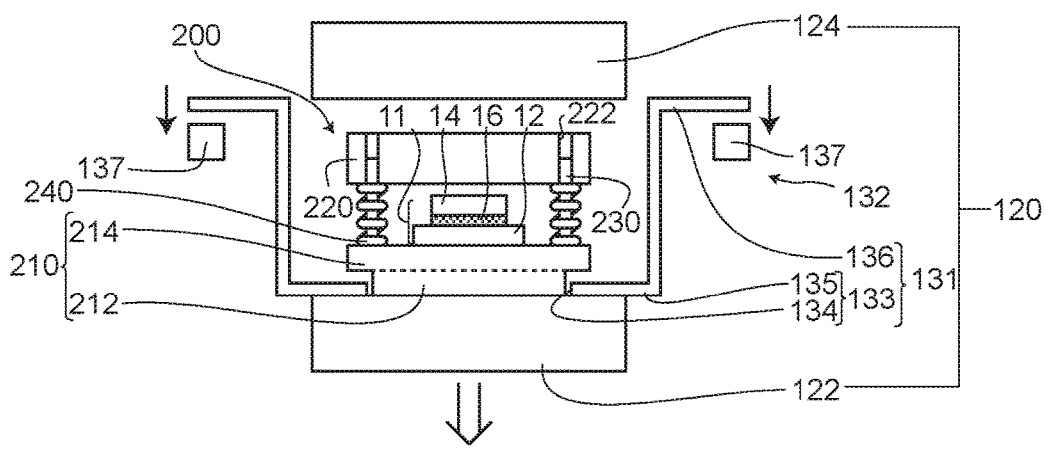
Figure 6C:
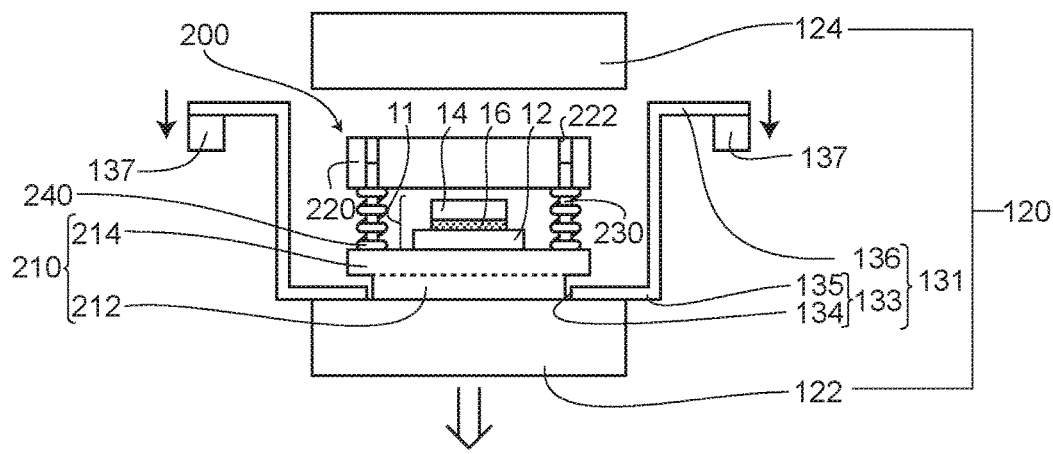

The second transfer member 220 is a plate-like member which is in contact with the electronic part 14 when pressure is applied to the pressure applying unit 200 (see FIG. 5C). The second transfer member 220 has a quadrangular shape as viewed in a plan view, and guide member receiving holes 222 are formed in the second transfer member 220 at positions corresponding to the guide members 230 (respective corner portions of the second transfer member 220).

As shown in FIG. 1B, the guide members 230 are rod-like members for connecting the first transfer member 210 and the second transfer member 220 to each other. The guide members 230 guide the second transfer member 220 while keeping parallelism of the second transfer member 220 with respect to the first transfer member 210. One end portions of the guide members 230 are connected to the first transfer member 210 at respective corner portions of the first transfer member 210, and the other end portions of the guide members 230 are inserted into the guide member receiving holes 222 respectively. The other end portions of the guide members 230 are configured such that the other end portions of the guide members 230 do not project from the guide member receiving holes 222 even when pressure is applied to the pressure applying unit 200.

The distance adjusting mechanism 240 is a resilient member such as a coil spring for adjusting a distance between the first transfer member 210 and the second transfer member 220. The distance adjusting mechanisms 240 make the second transfer member 220 and the electronic part 14 disposed away from each other when pressure is not applied to the pressure applying unit 200, and brings the second transfer member 220 and the electronic part 14 into contact with each other when pressure is applied to the pressure applying unit 200.

Next, a body of the bonding device 100 according to the embodiment 1 is explained.

Figure 2:
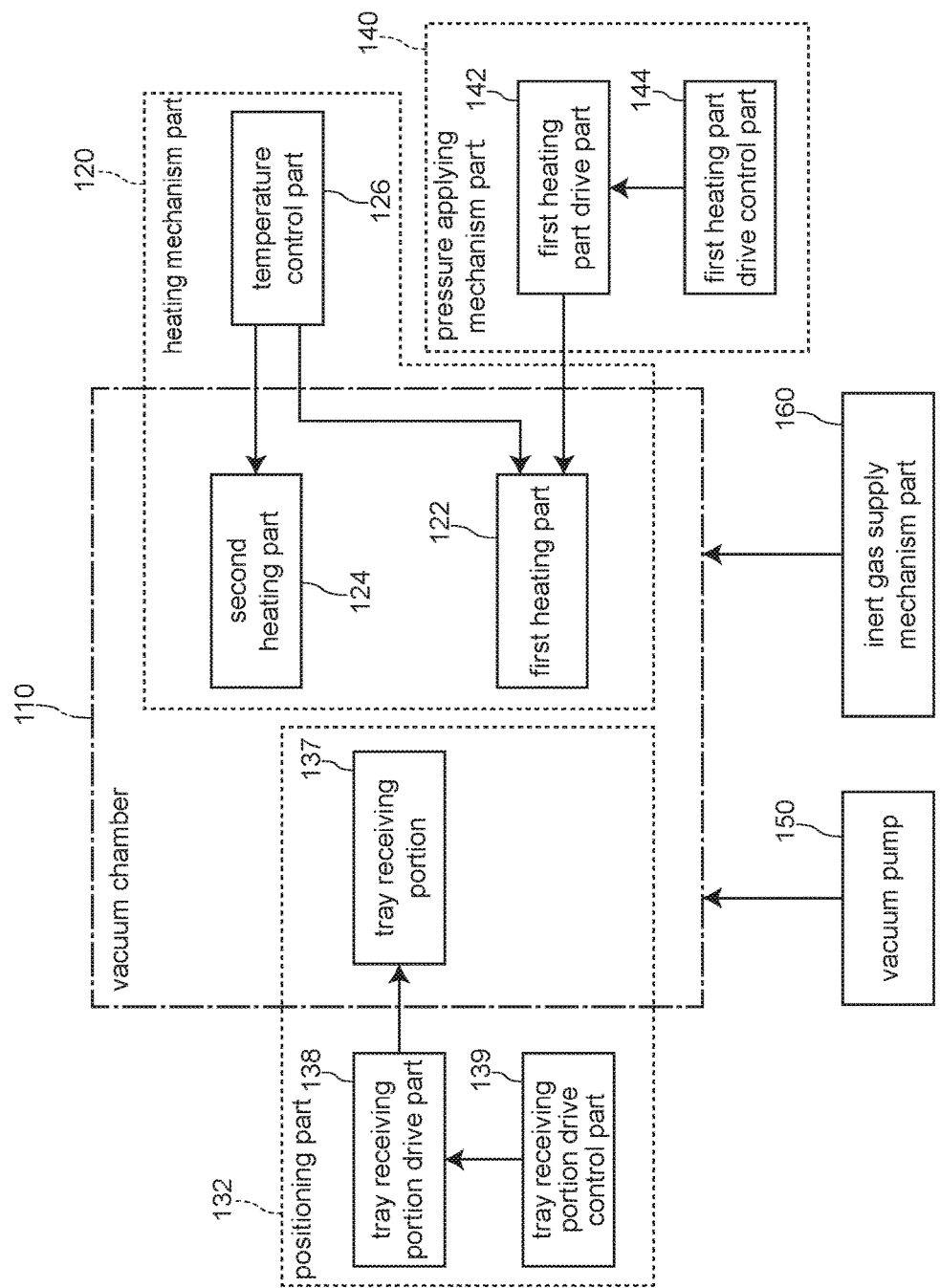
FIG. 2 is a block diagram of an essential part of the bonding device 100 according to the embodiment 1.

As shown in FIG. 1 and FIG. 2, the bonding device 100 according to the embodiment 1 includes a chamber 110, a heating mechanism part 120, a positioning mechanism part 130, a pressure applying mechanism part 140, a vacuum pump 150, and an inert gas supply mechanism part 160.

The chamber 110 (for example, a vacuum chamber) is disposed at a position where the chamber 110 surrounds a first heating part 122 and a second heating part 124.

The heating mechanism part 120 includes the first heating part 122, the second heating part 124, and a temperature control part 126 which controls temperatures of the first heating part 122 and the second heating part 124 respectively.

As shown in FIG. 1A, the first heating part 122 and the second heating part 124 are arranged in the inside of the chamber 110 at positions where the first heating part 122 and the second heating part 124 face each other in an opposed manner in the vertical direction. The first heating part 122 is positioned below the second heating part 124, and the first heating part 122 can be moved in the vertical direction by the pressure applying mechanism part 140 described later. The second heating part 124 is fixed.

When the tray 131 which accommodates the pressure applying unit 200 therein is mounted on the bonding device 100, the first heating part 122 is arranged on a first transfer member 210 side of the pressure applying unit 200, and the second heating part 124 is arranged on a second transfer member 220 side of the pressure applying unit 200.

The first heating part 122 and the second heating part 124 are respectively formed into a plate shape, and a heater 128 for heating is disposed in the inside of the first heating part 122 and in the inside of the second heating part 124 respectively. A heating temperature of the first heating part 122 and a heating temperature of the second heating part 124 are 300° C., for example.

The temperature control part 126 controls temperatures of the first heating part 122 and the second heating part 124 by controlling outputs to the heaters 128.

As shown in FIG. 1A, the positioning mechanism part 130 includes the tray 131 and a positioning part 132. The positioning mechanism part 130 positions the pressure applying unit 200 at a position where the pressure applying unit 200 is in contact with neither the first heating part 122 nor the second heating part 124 in a space defined between the first heating part 122 and the second heating part 124.

Figure 3:
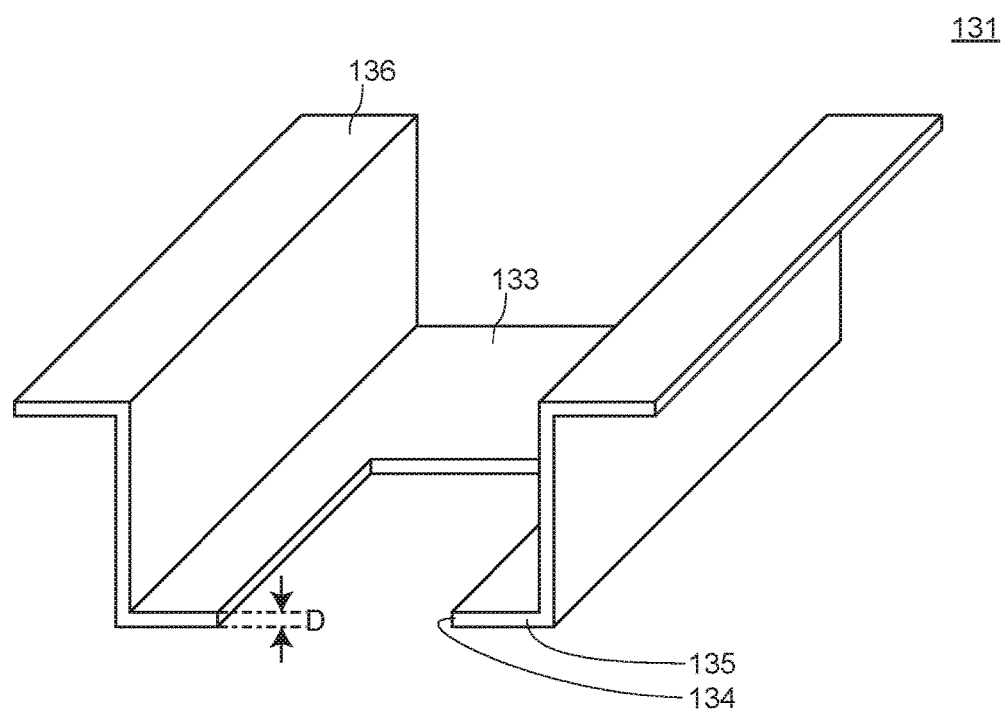
FIG. 3 is a view for explaining a tray 131 according to the embodiment 1.
Figure 4A:
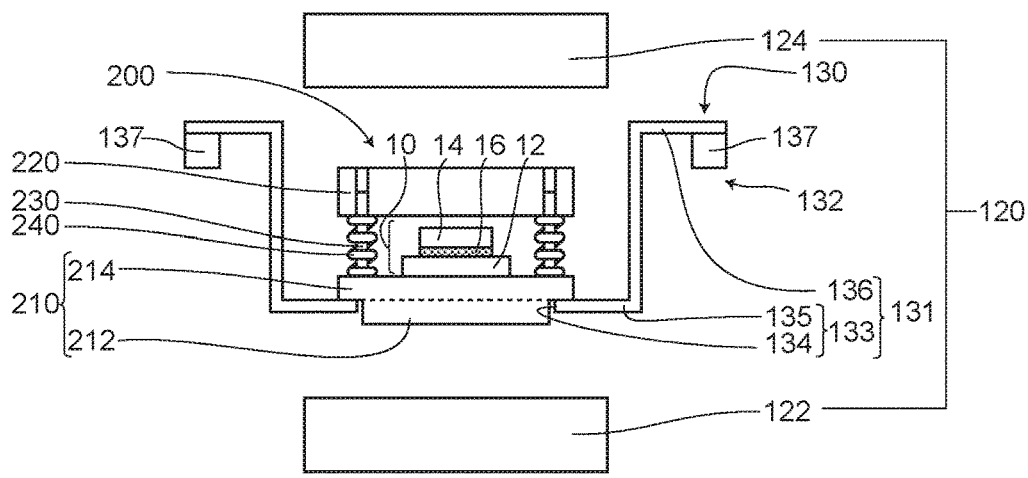
FIG. 4A to FIG. 4C are views for explaining a bonding method according to the embodiment 1.
Figure 4B:
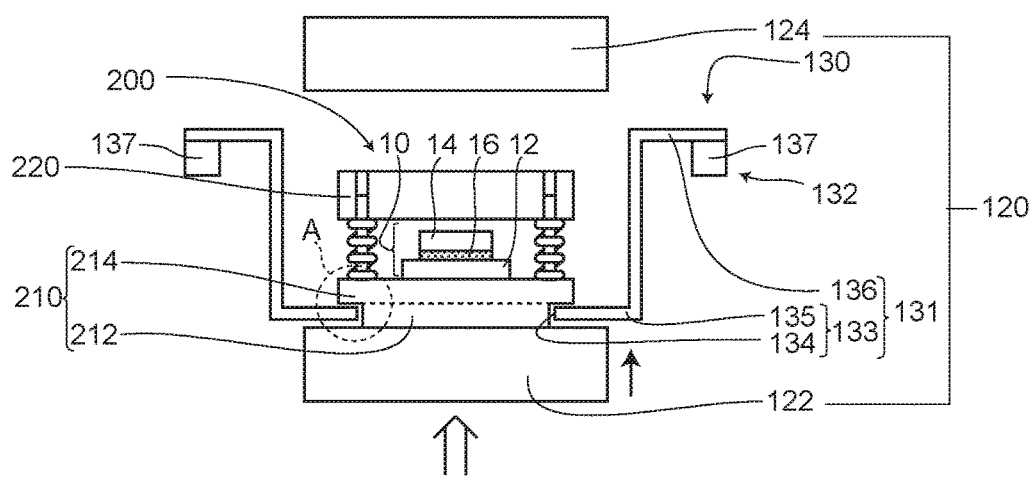
Figure 4C:
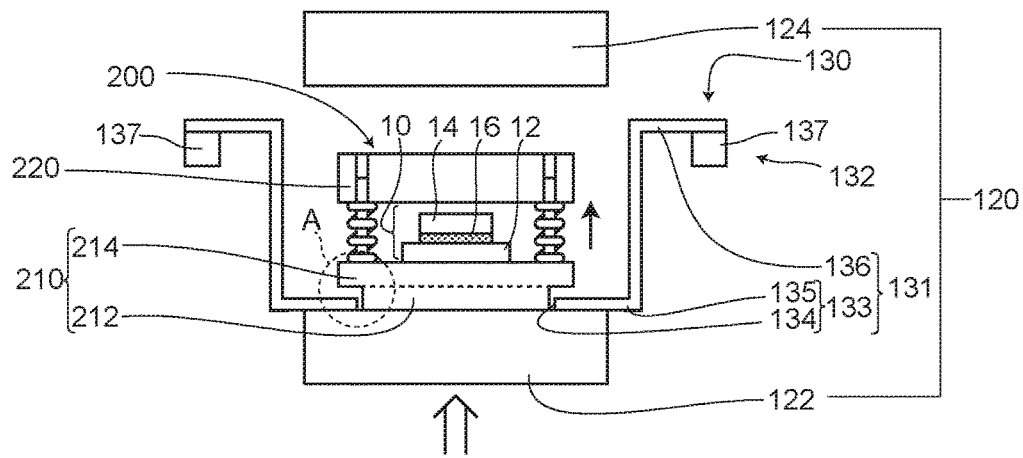

As shown in FIG. 3, the tray 131 is formed of a metal plate, and is configured such that both ends of a bottom surface 133 are bent upward and, thereafter, are bent outward at a predetermined height position respectively. A length of the bottom surface 133 in the lateral direction (a length from one end portion of the bottom surface 133 bent upward to the other end portion of which the bottom surface 133 bent upward (a length of the bottom surface 133 in the left-and-right direction in FIG. 3)) is set larger than a length of the second heating part 124 in the lateral direction (a length of the second heating part 124 in the left-and-right direction in FIG. 1A). The tray 131 accommodates the pressure applying unit 200 therein such that the first transfer member 210 is positioned on a lower side of the pressure applying unit 200, and the second transfer member 220 is positioned on an upper side of the pressure applying unit 200.

As shown in FIG. 1A and FIG. 3, an opening portion 134 is formed in the tray 131. A plateau portion 212 is inserted into the opening portion 134 when the pressure applying unit 200 is accommodated in the tray 131. Support portions 135 which support shoulder portions 214 when the tray 131 accommodates the pressure applying unit 200 therein is formed on the bottom surface 133 around the opening portion 134.

The opening portion 134 is formed in a state where the opening portion 134 is connected to an outer edge of the bottom surface 133. In inserting the plateau portion 212 of the pressure applying unit 200 into the opening portion 134, the plateau portion 212 can be inserted into the opening portion from above, and the plateau portion 212 can be inserted into the opening portion 134 also from the side by sliding the plateau portion 212.

The support portions 135 support the pressure applying unit 200. When the first transfer member 210 is not in contact with the first heating part 122, the support portions 135 support the shoulder portions 214, and when the first transfer member 210 is in contact with the first heating part 122, the support portions 135 are disposed away from the shoulder portions 214.

As shown in FIG. 2, the positioning part 132 includes tray receiving portions 137, a tray receiving portion drive part 138, and a tray receiving portion drive control part 139. The positioning part 132 can position the pressure applying unit 200 at a position where the pressure applying unit 200 is in contact with neither the first heating part 122 nor the second heating part 124 by positioning the tray 131 in which the pressure applying unit 200 is accommodated. The pressure applying unit 200 is positioned such that the tray 131 is accommodated in the pressure applying unit 200 and, thereafter, bent portions 136 which are bent toward the outside are placed on the tray receiving portions 137.

As shown in FIG. 1A, the tray receiving portions 137 receive the bent portions 136 of the tray 131. A stepped portion (not shown in the drawing) for deciding the position at which the tray 131 is to be placed is formed on the tray receiving portions 137. The tray receiving portion drive part 138 moves the tray receiving portions 137 in the vertical direction for adjusting a height position of the tray receiving portions 137. The tray receiving portion drive part 138 is formed of a suitable drive mechanism (for example, a servomotor, a hydraulic mechanism or the like). The tray receiving portion drive control part 139 adjusts a height position of the tray receiving portions 137 by controlling the tray receiving portion drive part 138.

As shown in FIG. 2, the pressure applying mechanism part 140 includes a first heating part drive part 142 and a first heating part drive control part 144. The pressure applying mechanism part 140 can move the first heating part 122 in the vertical direction (in the direction toward the second heating part 124 from the first heating part 122). The pressure applying mechanism part 140 applies pressure to the pressure applying unit 200 by sandwiching the pressure applying unit 200 between the first heating part 122 and the second heating part 124 by moving the first heating part 122 upward.

The pressure applying mechanism part 140 can move the pressure applying unit 200 and the tray 131 in the vertical direction by moving the first heating part 122 in the vertical direction (for example, see FIG. 5A). The pressure applying mechanism part 140 can move the first heating part 122 to an initial position (a position where the tray 131 is placed on the tray receiving portions 137) by moving the first heating part 122 downward after heating the pressure applying unit 200 while applying pressure to the pressure applying unit 200. Due to such movement of the first heating part 122, it is possible to bring the pressure applying unit 200 into a state where the pressure applying unit 200 is in contact with neither the first heating part 122 nor the second heating part 124 in a space defined between the first heating part 122 and the second heating part 124.

The first heating part drive part 142 moves the first heating part 122 in the vertical direction. The first heating part drive part 142 may be formed of a suitable drive mechanism (for example, a servomotor, a hydraulic mechanism or the like). The first heating part drive control part 144 controls a moving speed and a height position of the first heating part 122 by controlling the first heating part drive part 142.

The vacuum pump 150 creates a vacuum in the chamber 110. The inert gas supply mechanism part 160 supplies an inert gas (for example, an $N_2$ gas) into the inside of the chamber 110.

The bonding method according to the embodiment 1 is a bonding method for bonding a substrate and an electronic part to each other using the pressure applying unit 200 according to the embodiment 1 in a state where the pressure applying unit 200 according to the embodiment 1 is mounted on the bonding device 100. As shown in FIG. 4 to FIG. 7, in the bonding method according to the embodiment 1, a pressure applying unit preparing step, a pressure applying unit positioning step, a pressure applying unit moving step, a pressure applying unit pressure-applying and heating step, and a pressure applying unit cooling step are performed in this order. Hereinafter, the bonding method according to the embodiment 1 is explained in the order of steps.

(1) Pressure Applying Unit Preparing Step

Firstly, a metal particle paste 16 is applied by coating to the substrate 12 on which a conductor pattern is formed, and the electronic part 14 is arranged on the substrate 12 coated with the metal particle paste 16 thus preparing the assembled body 10. As the electronic part 14, a semiconductor element is used.

Next, the assembled body 10 is arranged on the first transfer member 210. Next, the guide members 230 are mounted in an erected manner on the corner portions of the first transfer member 210, and a distance adjusting mechanism 240 is arranged around each guide member 230. The assembled body 10 may be arranged on the first transfer member 210 where the guide members 230 are preliminarily mounted on corner portions of the first transfer member 210 in an erected manner. Next, the second transfer member 220 is arranged on the guide members 230, and the second transfer member 220 is supported by the distance adjusting mechanisms 240. The pressure applying unit 200 is prepared in accordance with the above-mentioned step.

(2) Pressure Applying Unit Positioning Step

Next, the plateau portion 212 of the first transfer member 210 is inserted into the opening portion 134 formed in the tray 131, and the pressure applying unit 200 is accommodated in the tray 131 in a state where the shoulder portions 214 of the first transfer member 210 are supported by the support portions 135.

Next, the tray 131 which accommodates the pressure applying unit 200 therein is placed on the tray receiving portions 137. Due to such an operation, the pressure applying unit 200 is positioned at a position where the pressure applying unit 200 is in contact with neither the first heating part 122 nor the second heating part 124 in a space between the first heating part 122 and the second heating part 124 (see FIG. 4A). At this stage of the operation, the height position of the pressure applying unit 200 is an intermediate height position between the first heating part 122 and the second heating part 124.

(3) Pressure Applying Unit Moving Step

Next, the first heating part 122 is moved upward in the direction toward the second heating part 124 from the first heating part 122 (along a vertical axis) by the pressure applying mechanism part 140.

The first heating part 122 and the second heating part 124 are heated in advance. Both a heating temperature of the first heating part 122 and a heating temperature of the second heating part 124 are 300° C., for example.

When the first heating part 122 is moved to a position where the first heating part 122 is in contact with the first transfer member 210, the first heating part 122 is brought into a state where the first heating part 122 pushes the plateau portion 212 of the pressure applying unit 200. Accordingly, a state is brought about where the support portions 135 of the tray 131 are disposed away from the shoulder portions 214 of the pressure applying unit 200 (see a region surrounded by a broken line A in FIG. 4B).

When the first heating part 122 is further moved upward from such a state, the pressure applying unit 200 is also moved upward. Accordingly, a state is brought about where the tray 131 is in contact with the first heating part 122 (see a region surrounded by a broken line A in FIG. 4C).

When the first heating part 122 is further moved upward from such a state, the pressure applying unit 200 and the tray 131 are also moved upward, and a state is brought about where the tray 131 is disposed away from the tray receiving portions 137 (see FIG. 5A).

When the first heating part 122 is further moved upward from such a state, the pressure applying unit 200 and the tray 131 are also moved upward, and a state is brought about where an upper surface of the second transfer member 220 of the assembled body 10 is in contact with the second heating part 124 (see FIG. 5B). At this stage of the operation, heat is started to be transferred to the second transfer member 220 from the second heating part 124 due to heat transfer. However, heat is not yet transferred to the assembled body 10.

(4) Pressure Applying Unit Pressure-Applying and Heating Step

When the first heating part 122 is further moved upward, the first transfer member 210 and the assembled body 10 are also moved upward, and the upper surface of the electronic part 14 and the second transfer member 220 are in contact with each other (see FIG. 5C).

By moving the first heating part 122 further upward as described above, the pressure applying unit 200 is applied with pressure by the first heating part 122 and the second heating part 124, and pressure is applied to the assembled body 10 (the metal particle paste 16 of the assembled body 10) by the first heating part 122 and the second heating part 124 through the first transfer member 210 and the second transfer member 220. Further, heat is transferred to the metal particle paste 16 of the assembled body 10 by the first heating part 122 and the second heating part 124 through the first transfer member 210 and the second transfer member 220.

The assembled body 10 can be heated while applying pressure to the assembled body 10 through the first transfer member 210 and the second transfer member 220 and hence, the metal particle paste 16 can be heated while being applied with pressure. As a result, the metal particle paste 16 can be baked, and it is possible to form the bonded body 11 where the substrate 12 and the electronic part 14 are bonded to each other with the baked metal particle paste 16 interposed therebetween.

(5) Pressure Applying Unit Cooling Step

Figure 7A:
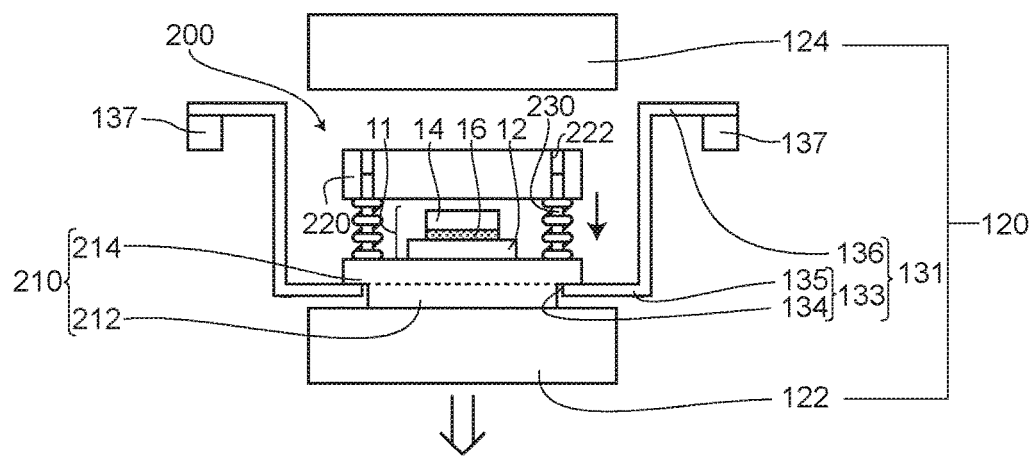
Figure 7B:
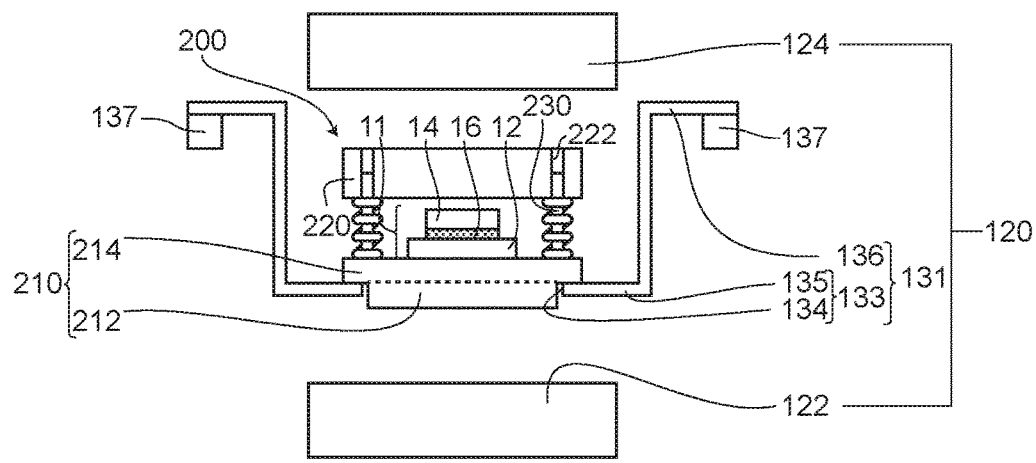
Figure 8:
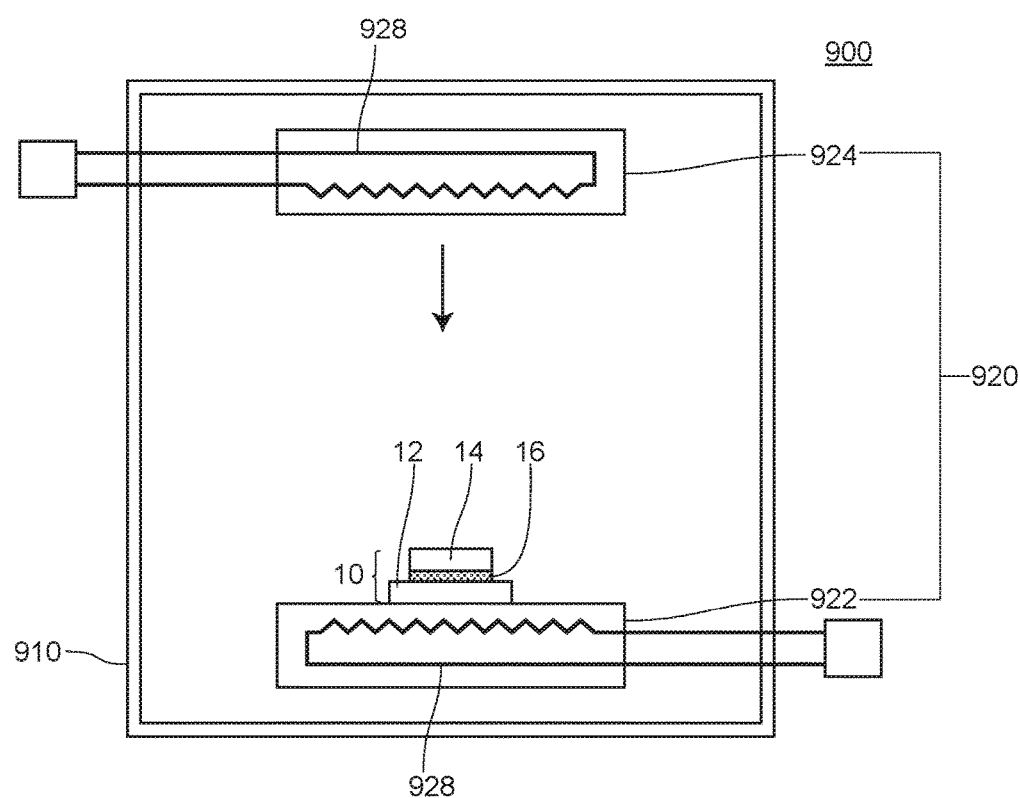
FIG. 8 is a view for explaining a conventional bonding device 900.

After the metal particle paste 16 is baked, the pressure applying unit 200 and the tray 131 are moved downward by moving the first heating part 122 downward (see FIG. 6A to FIG. 6C and FIG. 7A) so that the tray 131 which accommodates the pressure applying unit 200 therein and the first heating part 122 are returned to respective initial positions (see FIG. 7B). With such an operation, the pressure applying unit 200 is brought into a state where the pressure applying unit 200 is disposed away from both the first heating part 122 and the second heating part 124 and hence, it is possible to cool the pressure applying unit 200.

In this manner, the substrate 12 and the electronic part 14 can be bonded to each other.

Next, advantageous effects of the bonding device 100, the bonding method and the pressure applying unit 200 according to the embodiment 1 are explained.

According to the bonding device 100 and the bonding method of the embodiment 1, the bonding device 100 includes the positioning mechanism part 130 for positioning the pressure applying unit 200 at a position where the pressure applying unit 200 is in contact with neither the first heating part 122 nor the second heating part 124. With such a configuration, it is possible to heat the pressure applying unit 200 while applying pressure to the pressure applying unit 200 using the first heating part 122 and the second heating part 124 after positioning the pressure applying unit 200 at the position where the pressure applying unit 200 is in contact with neither the first heating part 122 nor the second heating part 124. Accordingly, it is possible to prevent heat from being transferred to the metal particle paste 16 from the first heating part 122 before pressure is applied to the pressure applying unit 200 thus preventing the metal particle paste 16 from partially generating a sintering reaction (solidifying reaction). As a result, the substrate 12 and the electronic part 14 can be bonded to each other with a bonding strength higher than a bonding strength used in the prior art.

Further, according to the bonding device 100, the bonding method and the pressure applying unit 200 of the embodiment 1, the pressure applying unit 200 having the first transfer member 210 and the second transfer member 220 which transfer pressure and heat to the assembled body 10 in a state where the assembled body 10 is sandwiched between the first transfer member 210 and the second transfer member 220 is used and hence, a time necessary for transferring heat to the metal particle paste 16 can be delayed compared to the conventional bonding device 900. Accordingly, even when pressure is applied to the pressure applying unit 200 in a state where the first heating part 122 and the second heating part 124 are heated, it is possible to prevent heat from being transferred to the metal particle paste 16 from the first heating part 122 before pressure is applied to the pressure applying unit 200 thus preventing the metal particle paste 16 from partially generating a sintering reaction. As a result, also from such a viewpoint, the substrate 12 and the electronic part 14 can be bonded to each other with a bonding strength higher than a bonding strength used in the prior art.

Further, according to the bonding device 100, the bonding method and the pressure applying unit 200 of the embodiment 1, the pressure applying unit 200 having the first transfer member 210 and the second transfer member 220 which transfer pressure and heat to the assembled body 10 in a state where the assembled body 10 is sandwiched between the first transfer member 210 and the second transfer member 220 is used. With such a configuration, by moving the second transfer member 220 while keeping parallelism of the second transfer member 220 with respect to the first transfer member 210, it is possible to prevent the occurrence of the difference in pressure between respective portions of the electronic part 14. As a result, the substrate 12 and the electronic part 14 can be uniformly bonded to each other.

Further, according to the bonding device 100, the bonding method and the pressure applying unit 200 of the embodiment 1 uses the pressure applying unit 200 having the first transfer member 210 and the second transfer member 220 which transfer pressure and heat to the assembled body 10 in a state where the assembled body 10 is sandwiched between the first transfer member 210 and the second transfer member 220 is used. With such a configuration, even when pressure is applied to the pressure applying unit 200 in a state where the first heating part 122 and the second heating part 124 are heated, it is possible to prevent heat from being transferred to the metal particle paste 16 from the first heating part 122 before pressure is applied to the pressure applying unit 200. Accordingly, it is unnecessary to change temperatures of the first heating part 122 and the second heating part 124 when pressure is being applied to the pressure applying unit 200 and hence, the substrate 12 and the electronic part 14 can be bonded to each other in a relatively short tact time.

Further, according to the bonding device 100 of the embodiment 1, the positioning mechanism part 130 includes the tray 131 having the bottom surface 133 in which the opening portion 134 which allows the insertion of the plateau portion 212 therein at the time of accommodating the pressure applying unit 200 in the tray is formed and on which the support portions 135 for supporting the shoulder portions 214 are formed around the opening portion 134 at the time of accommodating the pressure applying unit 200 in the tray. Accordingly, the position of the pressure applying unit 200 accommodated in the tray 131 is minimally displaced in the horizontal direction.

Further, according to the bonding device 100 of the embodiment 1, the positioning mechanism part 130 includes the positioning part 132 capable of positioning the pressure applying unit 200 to a position where the pressure applying unit 200 is in contact with neither the first heating part 122 nor the second heating part 124 by positioning the tray 131 in which the pressure applying unit 200 is accommodated. Accordingly, the pressure applying unit 200 can be easily positioned by merely positioning the tray 131 which accommodates the pressure applying unit 200 therein.

Further, according to the bonding device 100 of the embodiment 1, the first heating part 122 is positioned below the second heating part 124, and the pressure applying mechanism part 140 is configured to apply pressure to the pressure applying unit 200 by moving the first heating part 122 upward and hence, the first heating part 122 pushes the plateau portion 212 of the pressure applying unit 200 by merely moving the first heating part 122. Accordingly, it is possible to provide a state where the pressure applying unit 200 is not supported by the tray 131 thus applying pressure to the pressure applying unit 200 without being influenced by the tray 131. As a result, the substrate 12 and the electronic part 14 can be relatively easily and uniformly bonded to each other with high accuracy.

Further, according to the bonding device 100 of the embodiment 1, the pressure applying mechanism part 140 can move the pressure applying unit 200 and the tray 131 in the vertical direction by moving the first heating part 122 in the vertical direction and hence, it is unnecessary to provide a new mechanism for moving the pressure applying unit 200.

Further, according to the bonding device 100 of the embodiment 1, the support portions 135 are brought into a state where the support portions 135 support the shoulder portions 214 when the first transfer member 210 is not into contact with the first heating part 122, and is brought into a state where the support portions 135 are disposed away from the shoulder portions 214 when the first transfer member 210 is in contact with the first heating part 122. Accordingly, at the time of mounting the pressure applying unit 200 on the bonding device 100 in a state where the pressure applying unit 200 is accommodated in the tray 131, the support portions 135 of the tray 131 support the shoulder portions 214 and hence, it is possible to provide a state where the pressure applying unit 200 is supported by the tray 131. Further, at the time of applying pressure to the pressure applying unit 200, by pushing the plateau portion 212 toward the inside from the outside, it is possible to provide a state where the pressure applying unit 200 is not supported by the tray 131. Accordingly, it is possible to apply pressure to the pressure applying unit 200 without being influenced by the tray 131 and, as a result, the substrate 12 and the electronic part 14 can be bonded to each other more uniformly.

Further, according to the bonding device 100 of the embodiment 1, after the pressure applying unit 200 is heated while being applied with pressure, the first heating part 122 is moved downward so as to bring the pressure applying unit 200 into a state where the pressure applying unit 200 is in contact with neither the first heating part 122 nor the second heating part 124 in a space defined between the first heating part 122 and the second heating part 124 and hence, it is possible to cool the pressure applying unit 200 without changing temperatures of the first heating part 122 and the second heating part 124. Accordingly, it is unnecessary to wait the lowering of temperatures of the first heating part 122 and the second heating part 124 so that the substrate 12 and the electronic part 14 can be bonded to each other more efficiently.

Further, the bonding device 100 of the embodiment 1 includes: the chamber 110 disposed at a position where the chamber 110 surrounds the first heating part 122 and the second heating part 124; and the vacuum pump 150 for creating a vacuum in the chamber 110 and hence, it is possible to suppress oxidation of the metal particle paste 16 before the pressure applying unit pressure-applying and heating step is performed thus preventing the lowering of a bonding strength between the substrate 12 and the electronic part 14.

Further, the bonding device 100 of the embodiment 1 includes the inert gas supply mechanism part 160 capable of supplying an inert gas into the chamber 110 and hence, it is possible to suppress oxidation of the metal particle paste 16 further surely before the pressure applying unit pressure-applying and heating step is performed thus preventing the lowering of a bonding strength between the substrate 12 and the electronic part 14 with certainty.

According to the pressure applying unit 200 of the embodiment 1, the first transfer member 210 has: the plateau portion 212 which projects toward the outside at the center portion of the surface of the first transfer member 210 on a side opposite to the surface of the first transfer member 210 which faces the second transfer member 220 in an opposed manner; and the shoulder portions 214 formed around the plateau portion 212. With such a configuration, in mounting the pressure applying unit 200 on the bonding device 100 in a state where the pressure applying unit 200 is accommodated in the tray 131, since the support portions 135 of the tray 131 support the shoulder portions 214, it is possible to provide a state where the pressure applying unit 200 is supported by the tray 131 and, at the same time. Further, in applying pressure to the pressure applying unit 200, by pushing the plateau portion 212 toward the inside from the outside, it is possible to provide a state where the pressure applying unit 200 is not supported by the tray 131. Accordingly, it is possible to apply pressure to the pressure applying unit 200 without being influenced by the tray 131 and, as a result, the substrate 12 and the electronic part 14 can be bonded to each other more uniformly.

Further, according to the pressure applying unit 200 of the embodiment 1, the first transfer member 210 has: the plateau portion 212 which projects toward the outside at the center portion of the surface of the first transfer member 210 on a side opposite to the surface of the first transfer member 210 which faces the second transfer member 220 in an opposed manner; and the shoulder portions 214 formed around the plateau portion 212 and hence, when the pressure applying unit 200 is accommodated in the tray 131, the position of the pressure applying unit 200 is minimally displaced by inserting the plateau portion 212 into the opening portion 134 formed in the tray 131.

Embodiment 2

A bonding device according to an embodiment 2 (not shown in the drawing) has the substantially same basic configuration as the bonding device 100 according to the embodiment 1. However, the bonding device according to the embodiment 2 differs from the bonding device 100 according to the embodiment 1 with respect to a point that not only a first heating part but also a second heating part is moved. That is, in the bonding device according to the embodiment 2, a pressure applying mechanism part moves the first heating part upward and, at the same time, moves the second heating part downward.

The pressure applying mechanism part further includes, in addition to the constitutional elements of the pressure applying mechanism part 140 of the embodiment 1, a second heating part drive part for moving the second heating part; and a second heating part drive control part for controlling the second heating part drive part.

As described above, the bonding device according to the embodiment 2 differs from the bonding device 100 according to the embodiment 1 with respect to the point that not only the first heating part but also the second heating part is moved. However, substantially in the same manner as the bonding device 100 of the embodiment 1, the bonding device according to the embodiment 2 includes a positioning mechanism part for positioning the pressure applying unit at a position where the pressure applying unit is in contact with neither the first heating part nor the second heating part. With such a configuration, it is possible to heat the pressure applying unit while applying pressure to the pressure applying unit using the first heating part and the second heating part after positioning the pressure applying unit at the position where the pressure applying unit is in contact with neither the first heating part nor the second heating part. Accordingly, it is possible to prevent heat from being transferred to a metal particle paste from the first heating part before pressure is applied to the pressure applying unit thus preventing the metal particle paste from partially generating a sintering reaction (solidifying reaction). As a result, the substrate and the electronic part can be bonded to each other with a high bonding strength.

Further, according to the bonding device of the embodiment 2, the pressure applying mechanism part moves the first heating part upward and, at the same time, moves the second heating part downward and hence, moving time of the first heating part and the second heating part can be shortened whereby the substrate and the electronic part can be efficiently bonded to each other.

The bonding device according to the embodiment 2 has substantially the same configuration as the bonding device 100 of the embodiment 1 except for the point that not only the first heating part but also the second heating part is moved. Accordingly, the bonding device according to the embodiment 2 can acquire advantageous effects which correspond to the advantageous effects out of the advantageous effects which the bonding device 100 of the embodiment 1 can acquire.

Although the present invention has been explained heretofore by reference to the above-mentioned embodiments, the present invention is not limited to the above-mentioned embodiments. Various modifications are conceivable without departing from the gist of the present invention. For example, the following modifications are also conceivable.

(1) The number, materials, shapes, positions, sizes and the like of the constitutional elements described in the above-mentioned embodiments are merely examples, and can be changed within a range where the advantageous effects of the present invention are not impaired.

(2) In the above-mentioned respective embodiments, the first heating part is positioned below the second heating part, and the pressure applying mechanism part applies pressure to the pressure applying unit by moving the first heating part downward. However, the present invention is not limited to such a configuration. The first heating part may be positioned above the second heating part, and the pressure applying mechanism part may be configured to apply pressure to the pressure applying unit by moving the first heating part downward. In this case, the bonding device may further include a mechanism for preventing falling of the pressure applying unit even in a state where the pressure applying unit is not supported by the tray (for example, a suction mechanism which sucks the pressure applying unit upward).

(3) In the above-mentioned respective embodiments, the first heating part and the second heating part are arranged in the vertical direction. However, the present invention is not limited to such a configuration. The first heating part and the second heating part may be arranged in the left-and-right direction. In this case, the pressure applying mechanism part applies pressure to the pressure applying unit by moving the first heating part (or the second heating part) in a rightward or leftward direction.

(4) In the above-mentioned respective embodiments, the first heating part is arranged on a first transfer member side of the pressure applying unit, and the second heating part is arranged on a second transfer member side of the pressure applying unit. However, the present invention is not limited to such a configuration. The first heating part may be arranged on a second transfer member side of the pressure applying unit, and the second heating part may be arranged on a first transfer member side of the pressure applying unit.

(5) In the above-mentioned respective embodiments, although temperatures of both the first heating part and the second heating part are set to 300° C., the present invention is not limited to such a configuration. Temperatures of the first heating part and the second heating part can be set to arbitrary temperatures provided that these temperatures are set to temperatures at which the metal particle paste generates a sintering reaction. Here, temperatures of the first heating part and the second heating part may be equal to each other or may be different from each other.

REFERENCE SIGNS LIST

10: assembled body, 11: bonded body, 12: substrate, 14: electronic part (semiconductor element), 16: metal particle paste, 100: bonding device, 110: chamber, 120: pressure applying mechanism part, 122: first heating part, 124: second heating part, 126: temperature control part, 130: positioning part, 131: tray, 132: positioning part, 133: bottom surface, 134: support portion, 135: opening portion, 136: bent portion (of tray), 137: tray receiving portion, 138: tray receiving portion drive part, 139: tray receiving portion drive control part, 140: pressure applying mechanism part, 142: first heating part drive part, 144: first heating part control part, 150: vacuum pump, 160: inert gas supply mechanism part, 200: pressure applying unit, 210: first transfer member, 212: plateau portion, 214: shoulder portion, 220: second transfer member, 222: guide member receiving hole, 230: guide member, 240: distance adjusting mechanism

The invention claimed is:

1. A bonding device for bonding a substrate and an electronic part of an assembled body which is formed by mounting the electronic part on the substrate with a metal particle paste sandwiched therebetween, the bonding device being configured to bond the substrate and the electronic part to each other by heating a pressure applying unit having a first transfer member and a second transfer member which transfer pressure and heat to the assembled body in a state where the assembled body is sandwiched between the first transfer member and the second transfer member while applying pressure to the pressure applying unit, wherein
the bonding device further comprises:
a heating mechanism part having a first heating part and a second heating part arranged at positions opposite to each other;
a positioning mechanism part for positioning the pressure applying unit at a position where the pressure applying unit is in contact with neither the first heating part nor the second heating part in a space defined between the first heating part and the second heating part; and
a pressure applying mechanism part for applying pressure to the pressure applying unit by moving at least one of the first heating part and the second heating part in a direction from one of the first heating part and the second heating part toward the other of the first heating part and the second heating part, wherein
the first transfer member includes: a plateau portion projecting toward the outside at a center portion of a surface of the first transfer member on a side opposite to a surface of the first transfer member which faces the second transfer member in an opposed manner; and a shoulder portion formed around the plateau portion; and
the positioning mechanism part includes:
a tray having a bottom surface in which an opening portion which allows the insertion of the plateau portion therein at the time of accommodating the pressure applying unit in the tray is formed and on which a support portion for supporting the shoulder portion at the time of accommodating the pressure applying unit in the tray is formed around the opening portion; and
a positioning part capable of positioning the pressure applying unit at a position where the pressure applying unit is in contact with neither the first heating part nor the second heating part by positioning the tray in which the pressure applying unit is accommodated,
the first heating part is positioned below the second heating part, and
the pressure applying mechanism part is configured to apply pressure to the pressure applying unit by moving the first heating part upward, and
the pressure applying mechanism part is configured to move the pressure applying unit and the tray in a vertical direction by moving the first heating part in a vertical direction,
the first heating part is arranged on a first transfer member side of the pressure applying unit, and the second heating part is arranged on a second transfer member side of the pressure applying unit,
the support portion is brought into a state where the support portion supports the shoulder portion when the first transfer member is not in contact with the first heating part, and is brought into a state where the support portion is disposed away from the shoulder portion when the first transfer member is in contact with the first heating part, and
the bottom surface of the tray is in contact with the first heating part in a state of the plateau portion being inserted into the opening portion when the pressure applying unit and the tray are moved in a vertical direction by moving the first heating part in a vertical direction.

2. The bonding device according to claim 1, wherein the pressure applying mechanism part is configured such that, after the pressure applying mechanism part heats the pressure applying unit while applying pressure to the pressure applying unit, the pressure applying mechanism part brings the pressure applying unit into a state where the pressure applying unit is in contact with neither the first heating part nor the second heating part in a space defined between the first heating part and the second heating part by moving the first heating part downward.

3. The bonding device according to claim 1, wherein the pressure applying mechanism part is configured to apply pressure to the pressure applying unit by moving the first heating part upward and by moving the second heating part downward.

4. The bonding device according to claim 1 further comprising: a chamber disposed at a position where the chamber surrounds the first heating part and the second heating part; and
a vacuum pump for creating a vacuum in the chamber.

5. The bonding device according to claim 4 further comprising an inert gas supply mechanism capable of supplying an inert gas into the chamber.

6. The bonding device according to claim 1, wherein the first heating part is positioned above the second heating part, and the pressure applying mechanism part is configured to apply pressure to the pressure applying unit by moving the first heating part downward.

7. A pressure applying unit used in the bonding device according to claim 1, the pressure applying unit comprising the first transfer member and the second transfer member arranged at positions opposite to each other for transferring pressure and heat to the assembled body, and
the first transfer member includes: a plateau portion which projects toward the outside at a center portion of a surface of the first transfer member on a side opposite to a surface of the first transfer member which faces the second transfer member in an opposed manner; and a shoulder portion formed around the plateau portion, wherein
the pressure applying unit is used with a tray having a bottom surface in which an opening portion is formed and on which a support portion is formed around the opening portion, and the plateau portion is inserted in the opening portion and the shoulder portion is supported by the support portion when the pressure applying unit is accommodated in the tray.

8. A pressure applying unit used in the bonding device according to claim 1, the pressure applying unit comprising the first transfer member and the second transfer member arranged at positions opposite to each other for transferring pressure and heat to the assembled body, and
the first transfer member includes: a plateau portion which projects toward the outside at a center portion of a surface of the first transfer member on a side opposite to a surface of the first transfer member which faces the second transfer member in an opposed manner; and a shoulder portion formed around the plateau portion, wherein
a tray having a bottom surface with an opening portion and on which a support portion surrounds the opening portion on at least three sides is located such that the plateau portion is inserted into the opening portion and the shoulder portion is supported by the support portion such that the pressure applying unit is accommodated in the tray.

* * * * *